(12) United States Patent
Choi

(10) Patent No.: US 12,050,503 B2
(45) Date of Patent: Jul. 30, 2024

(54) STORAGE DEVICE AND OPERATING METHOD THEREOF

(71) Applicant: SK hynix Inc., Gyeonggi-do (KR)

(72) Inventor: Woo Sick Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 160 days.

(21) Appl. No.: 17/711,807

(22) Filed: Apr. 1, 2022

(65) Prior Publication Data

US 2023/0083500 A1 Mar. 16, 2023

(30) Foreign Application Priority Data

Sep. 13, 2021 (KR) .......................... 10-2021-0121731

(51) Int. Cl.
*G11C 5/14* (2006.01)
*G06F 1/3225* (2019.01)
*G06F 1/3234* (2019.01)

(52) U.S. Cl.
CPC .......... *G06F 1/3275* (2013.01); *G06F 1/3225* (2013.01); *G11C 5/147* (2013.01)

(58) Field of Classification Search
CPC ..... G06F 1/3275; G06F 1/3225; G11C 5/147; G11C 16/0483; G11C 16/30; Y02D 10/00

USPC .......................................................... 365/226
See application file for complete search history.

(56) References Cited

U.S. PATENT DOCUMENTS

| 2016/0111134 A1* | 4/2016 | Kim | ....................... G11C 5/143 365/226 |
| 2017/0294216 A1* | 10/2017 | Doo | ....................... G06F 1/324 |

FOREIGN PATENT DOCUMENTS

| CN | 105528048 | * 10/2015 | ............ G11C 5/143 |
| CN | 107272867 | * 4/2017 | ........... G06F 1/3296 |
| KR | 10-1094224 B1 | 12/2011 | |
| KR | 10-2019-0111565 A | 10/2019 | |

* cited by examiner

*Primary Examiner* — Huan Hoang
*Assistant Examiner* — Minh Dinh
(74) *Attorney, Agent, or Firm* — IP & T GROUP LLP

(57) ABSTRACT

A storage device can decrease a leakage current. The storage device includes: a plurality of power switch cells for controlling power supplied to a memory device and a memory controller for controlling the memory device; a power management circuit for providing the plurality of power switch cells with a power voltage corresponding to the power; and a power management circuit controller for controlling the power management circuit to determine a magnitude of the power voltage according to whether the plurality of power switch cells supply the power to the memory device and the memory controller.

21 Claims, 12 Drawing Sheets

STORAGE DEVICE AND OPERATING METHOD THEREOF

CROSS-REFERENCE TO RELATED APPLICATION

The present application claims priority under 35 U.S.C. § 119(a) to Korean patent application number 10-2021-0121731, filed on Sep. 13, 2021, the entire disclosure of which is incorporated herein by reference.

BACKGROUND

1. Field of Invention

The present disclosure generally relates to an electronic device, and more particularly, to a storage device and an operating method thereof.

2. Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments of the present disclosure provide a storage device capable of decreasing a leakage current and an operating method of the storage device.

In accordance with an aspect of the present disclosure, there is provided a storage device including: a plurality of power switch cells configured to control power supplied to a memory device and a memory controller for controlling the memory device; a power management circuit configured to provide the plurality of power switch cells with a power voltage corresponding to the power; and a power management circuit controller configured to control the power management circuit to determine a magnitude of the power voltage according to whether the plurality of power switch cells supply the power to the memory device and the memory controller.

In accordance with another aspect of the present disclosure, there is provided a method of operating a storage device, the method including: determining whether to supply power to a memory device and a memory controller through a plurality of power switch cells; changing a magnitude of a power voltage corresponding to the power according to a result of the determining; and providing the plurality of power switch cells with the power voltage having the changed magnitude.

In accordance with an aspect of the present disclosure, there is provided a power supply circuit including: a power circuit configured to provide an element with power supply in a first mode and cut the power supply off in a second mode and a charging circuit configured to provide the power circuit with a first charging voltage in the first mode and with a second charging voltage in the second mode, wherein the second charging voltage is lower than the first charging voltage and has a least magnitude required for a power switch cell in the power circuit to normally operate.

BRIEF DESCRIPTION OF THE DRAWINGS

Various embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Furthermore, like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

Figure 1:
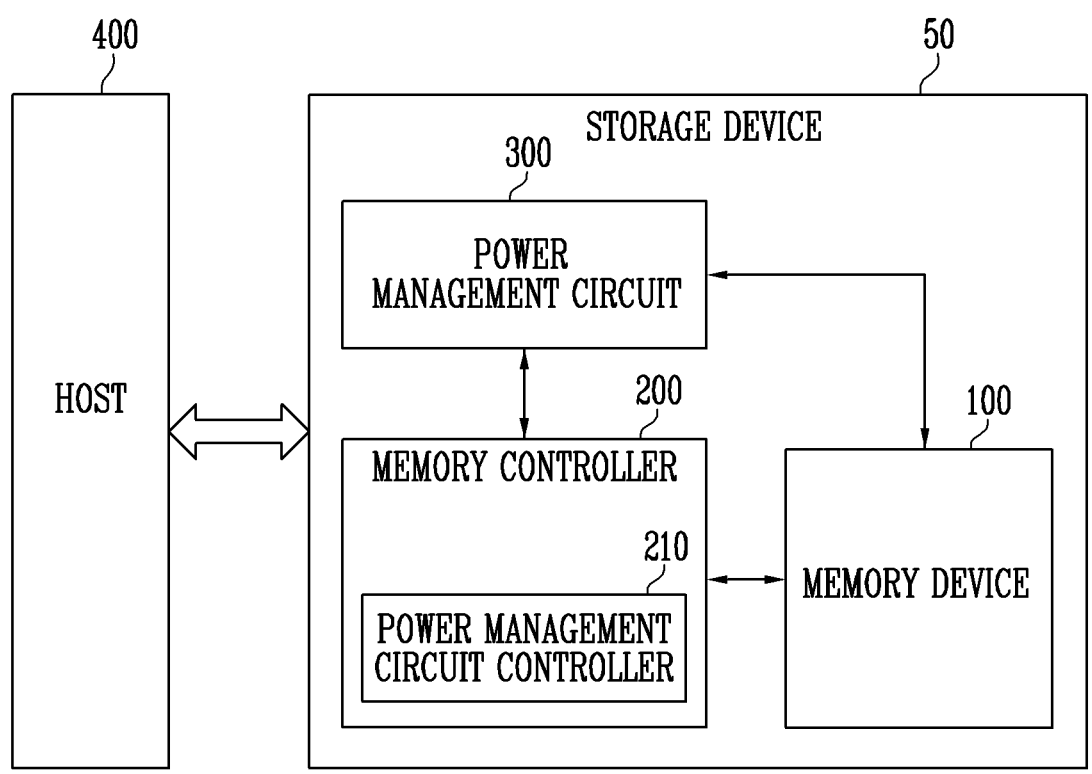
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 for controlling an operation of the memory device 100. The storage device 50 may be a device for storing data under the control of a host 400, such as a mobile phone, a smart phone, an MP3 player, a laptop computer, a desktop computer, a game console, a TV, a tablet PC or an in-vehicle infotainment system.

The storage device 50 may be manufactured as any of various types of storage devices according to a host interface that is a communication scheme with the host 400. For example, the storage device 50 may be implemented with any of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any various package types. For example, the storage device 50 may be manufactured as any of various package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array (not shown) including a plurality of memory cells for storing data.

Each of the memory cells may be configured as any of a Single Level Cell (SLC) storing one data bit, a Multi-Level Cell (MLC) storing two data bits, a Triple Level Cell (TLC) storing three data bits, and a Quadruple Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is described.

The memory device 100 may receive a command CMD and an address ADDR from the memory controller 200, and access an area selected by the address ADDR in the memory cell array. The memory device 100 may perform an operation indicated by the command CMD on the area selected by the address ADDR. For example, the memory device 100 may perform a write operation (program operation), a read operation, and an erase operation. In the program operation, the memory device 100 may program data in the area selected by the address ADDR. In the read operation, the memory device 100 may read data from the area selected by the address ADDR. In the erase operation, the memory device 100 may erase data stored in the area selected by the address ADDR.

In FIG. 1, it is illustrated that one memory device 100 is provided. However, in some embodiments, the storage device 50 may include a plurality of memory devices. A connection relationship between the plurality of memory devices and the memory controller 200 will be described with reference to FIG. 2.

The memory controller 200 may control overall operations of the storage device 50.

When power is applied to the storage device 50, the memory controller 200 may execute firmware (FW). When the memory device 100 is a flash memory device, the FW may include a host interface layer (HIL) for controlling communication with the host 400, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 400, and translate the LBA into a Physical Block Address (PBA) representing addresses of memory cells included in the memory device 100, in which data is to be stored. In this specification, the LBA and a "logic address" or "logical address" may be used with the same meaning. In this specification, the PBA and a "physical address" may be used with the same meaning.

The memory controller 200 may control the memory device 100 to perform a program operation, a read operation, an erase operation, or the like in response to a request from the host 400. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may be connected to the memory device 100 through a channel. For example, the 15 memory controller 200 may provide a command and an address to the memory device 100 through the channel, to control the memory device 100 to perform a program operation, a read operation, an erase operation, or the like.

In an embodiment, the memory controller 200 may autonomously generate a command, an address, and data regardless of any request from the host 400, and transmit the command, the address, and the data to the memory device 100. For example, the memory controller 200 may provide the memory device 100 with a command, an address, and data, which are used to perform read and program operations accompanied in performing wear leveling, read reclaim, garbage collection, etc.

In an embodiment, the memory controller 200 may control at least two memory devices 100. The memory controller 200 may control the memory devices according to an interleaving scheme to improve operational performance. The interleaving scheme may be a scheme for controlling operations on at least two memory devices 100 to overlap with each other.

In an embodiment, the memory controller 200 may include a power management circuit controller 210.

The power management circuit controller 210 may control an operation of a power management circuit 300.

The power management circuit 300 may provide a voltage to the memory device 100 and the memory controller 200. In an embodiment, the power management circuit 300 may provide the voltage having various levels required according to the type of the storage device 50. The voltage which the power management circuit 300 provides to the memory device 100 and the memory controller 200 may be a power voltage of the memory device 100 and the memory controller 200. The power management circuit 300 may be supplied with external power.

In an embodiment, the power management circuit 300 may include an auxiliary power device. The power management circuit 300 may charge the auxiliary power device by using the supplied external power. The power management circuit 300 may provide the memory device 100 and the memory controller 200 with any of the external power or auxiliary power included in the auxiliary power device.

There may be a case where a voltage level of the external power supplied to the storage device becomes lower than a specific voltage level. For example, a sudden power off (SPO) may occur and the external power is suddenly interrupted due to the SPO. The memory device 100 and the memory controller 200, which are included in the storage device 50, may perform various operations that should be completed even when power is interrupted. For example, the memory controller 200 should move data from a write cache buffer included in the storage device 50 to the memory device 100 even when the power is interrupted. In another example, a map update operation of storing mapping data indicating a relationship between a logical address and a physical address in the memory device should be completed even when the power is interrupted. When the power is interrupted, the storage device 50 may provide the auxiliary power to the memory device 100 and the memory controller 200 for a certain time in order to complete operations that should be completed even when the power is interrupted.

The host 400 may communicate with the storage device 50, using at least one of various communication standards or interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
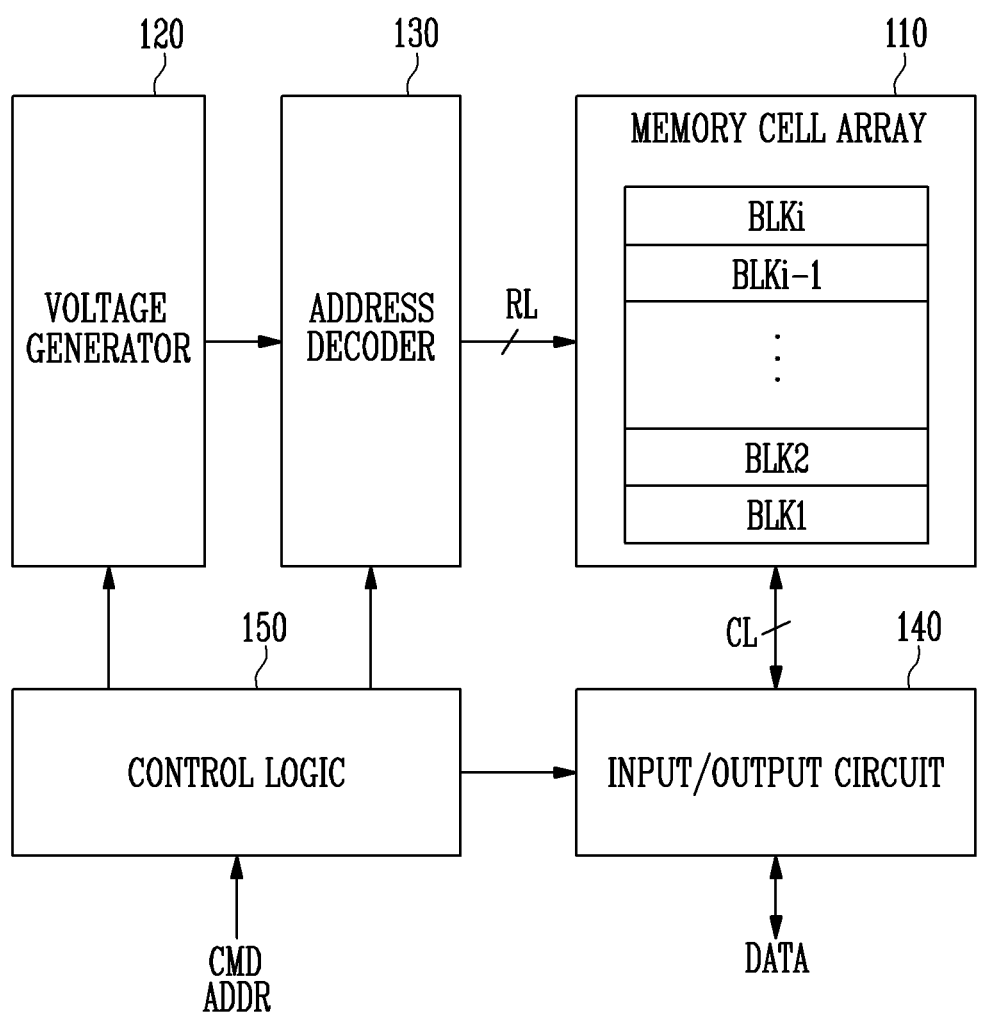
FIG. 2 is a diagram illustrating a memory device shown in FIG. 1 in accordance with an embodiment of the present disclosure.

FIG. 2 is a diagram illustrating the memory device shown in FIG. 1 in accordance with an embodiment of the present disclosure.

Referring to FIG. 2, the memory device 100 may include a memory cell array 110, a voltage generator 120, an address decoder 130, an input/output circuit 140, and a control logic 150.

The memory cell array 110 may include a plurality of memory blocks BLK1 to BLKi. The plurality of memory blocks BLK1 to BLKi may be connected to the address decoder 130 through row lines RL. The plurality of memory blocks BLK1 to BLKi may be connected to the input/output circuit 140 through column lines CL. In an embodiment, the row lines RL may include word lines, source select lines, and drain select lines. In an embodiment, the column lines CL may include bit lines.

Each of the plurality of memory blocks BLK1 to BLKi includes a plurality of memory cells. In an embodiment, the plurality of memory cells may be nonvolatile memory cells. Memory cells connected to the same word line among the plurality of memory cells may be defined as one physical page. That is, the memory cell array 110 may include a plurality of physical pages. Each of the memory cells of the memory device 100 may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

In an embodiment, the voltage generator 120, the address decoder 130, and the input/output circuit 140 may be commonly designated as a peripheral circuit. The peripheral circuit may drive the memory cell array 110 under the control of the control logic 150. The peripheral circuit may drive the memory cell array 110 to perform a program operation, a read operation, and an erase operation.

The voltage generator 120 may generate a plurality of operating voltages by using an external power voltage supplied to the memory device 100. The voltage generator 120 may operate under the control of the control logic 150.

In an embodiment, the voltage generator 120 may generate an internal power voltage by regulating the external power voltage. The internal power voltage generated by the voltage generator 120 may be used as an operating voltage of the memory device 100.

In an embodiment, the voltage generator 120 may generate a plurality of operating voltages by using the external power voltage or the internal power voltage. The voltage generator 120 may generate various voltages required in the memory device 100. For example, the voltage generator 120 may generate a plurality of erase voltages, a plurality of program voltages, a plurality of pass voltages, a plurality of select read voltages, and a plurality of unselect read voltages.

In order to generate a plurality of operating voltages having various voltage levels, the voltage generator 120 may include a plurality of pumping capacitors which receive the internal power voltage. The voltage generator 120 may generate the plurality of operating voltages by selectively activating the plurality of pumping capacitors under the control of the control logic 150.

The plurality of operating voltages generated by the voltage generator 120 may be supplied to the memory cell array 110 by the address decoder 130.

The address decoder 130 may be connected to the memory cell array 110 through the row lines RL. The address decoder 130 may operate under the control of the control logic 150. The address decoder 130 may receive an address ADDR from the control logic 150. The address decoder 130 may decode a block address in the received address ADDR. The address decoder 130 may select at least one memory block among the memory blocks BLK1 to BLKi according to the decoded block address. The address decoder 130 may decode a row address in the received address ADDR. The address decoder 130 may select at least one word line among word lines of the selected memory block according to the decoded row address. In an embodiment, the address decoder 130 may decode a column address in the received address ADDR. The address decoder 130 may connect the input/output circuit 140 and the memory cell array 110 to each other according to the decoded column address.

In accordance with an embodiment of the present disclosure, in a read operation, the address decoder 130 may apply a read voltage to the selected word line, and apply a read pass voltage having a level higher than that of the read voltage to unselected word lines.

The address decoder 130 may include components such as a row decoder, a column decoder, and an address buffer.

The input/output circuit 140 may include a plurality of page buffers. The plurality of page buffers may be connected to the memory cell array 110 through the bit lines. In a program operation, data stored in the plurality of page buffers may be provided to a selected physical page through the bit lines, and the provided data may be stored in memory cells included in the selected physical page. In a read operation, data stored in the memory cells included in the selected physical page may be sensed through the bit lines, and the sensed data may be stored in the page buffers.

The control logic 150 may control the address decoder 130, the voltage generator 120, and the input/output circuit 140. The control logic 150 may operate in response to a command CMD transferred from an external device. The control logic 150 may control the peripheral circuit by generating control signals in response to the command CMD and the address ADDR.

Figure 3:
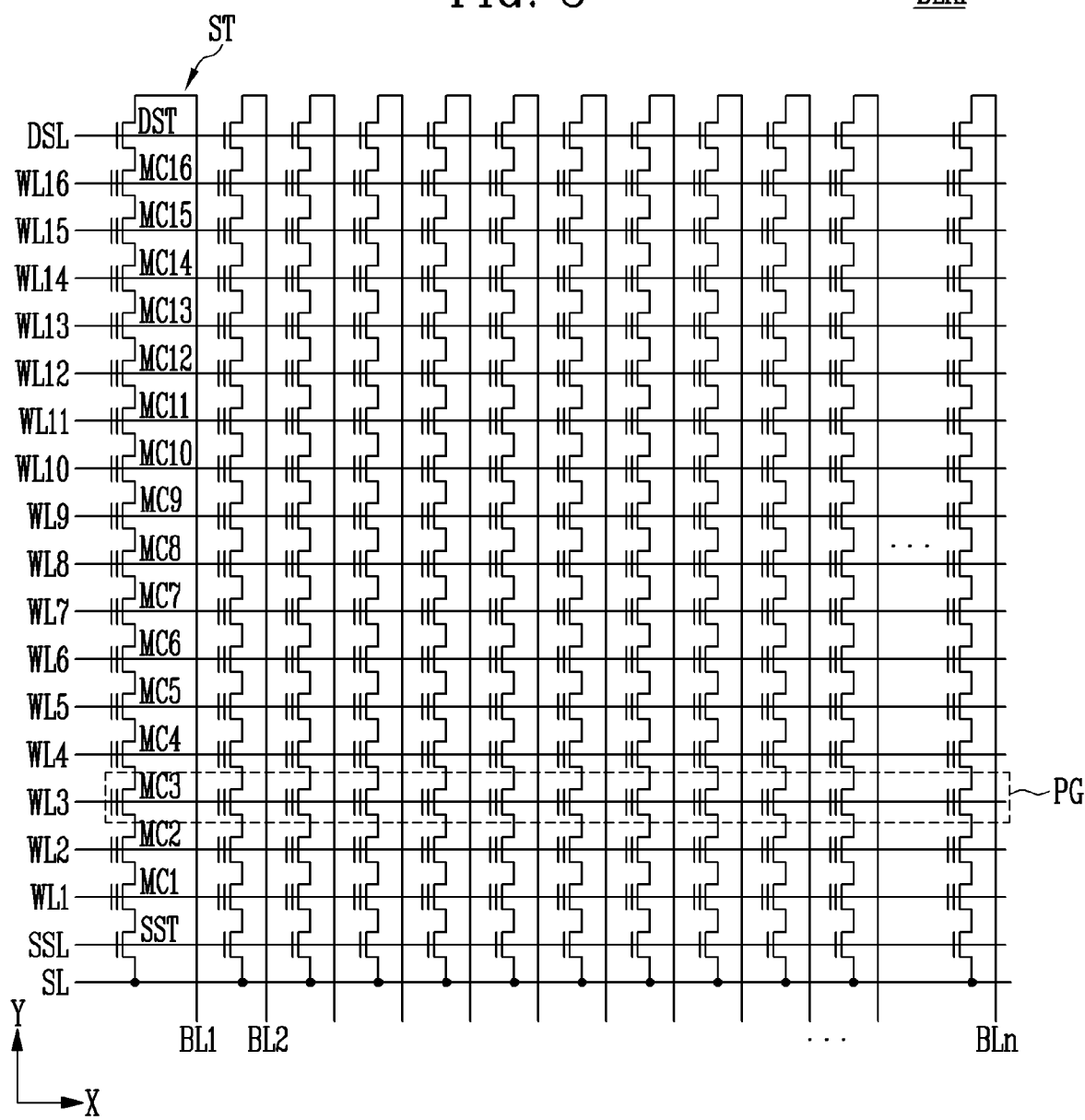
FIG. 3 is a diagram illustrating a structure of a memory block among memory blocks shown in FIG. 2 in accordance with an embodiment of the present disclosure.

FIG. 3 is a diagram illustrating a structure of a memory block among the memory blocks shown in FIG. 2 in accordance with an embodiment of the present disclosure.

A memory block BLKi represents a memory block BLKi among the memory blocks BLK1 to BLKi shown in FIG. 2.

Referring to FIG. 3, in the memory block BLKi, a plurality of word lines arranged in parallel to each other may be connected between a first select line and a second select line. The first select line may be a source select line SSL, and the second select line may be a drain select line DSL. More specifically, the memory block BLKi may include a plurality of strings ST connected between bit lines BL1 to BLm and a source line SL. The bit lines BL1 to BLm may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells MC1 to MC16, and a drain select transistor DST, which are connected in series to each other between the source line SL and the first bit line BL1. At least one drain select transistor DST may be included in one string ST, and a number of source select transistors which is greater than that of the source select transistor SST shown in the drawing and a number of memory cells which is greater than that of the memory cells MC1 to MC16 shown in the drawing may be included in the one string ST.

A source of the source select transistor SST may be connected to the source line SL, and a drain of the drain select transistor DST may be connected to the first bit line BL1. The memory cells MC1 to MC16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells MC1 to MC16 may be connected to a plurality of word lines WL1 to WL16. A group of memory cells connected to the same word line among memory cells included in different strings ST may be referred to as a physical page PG. Therefore, physical pages PG corresponding to the number of the word lines WL1 to WL16 may be included in the memory block BLKi.

One memory cell may store one-bit data. The one memory cell is generally referred to as a single level cell (SLC). One physical page PG may store one logical page (LPG) data. One LPG data may include data bits corresponding to the number of cells included in the one physical page PG.

One memory cell may store two or more-bit data. One physical page PG may store two or more LPG data.

Figure 4:
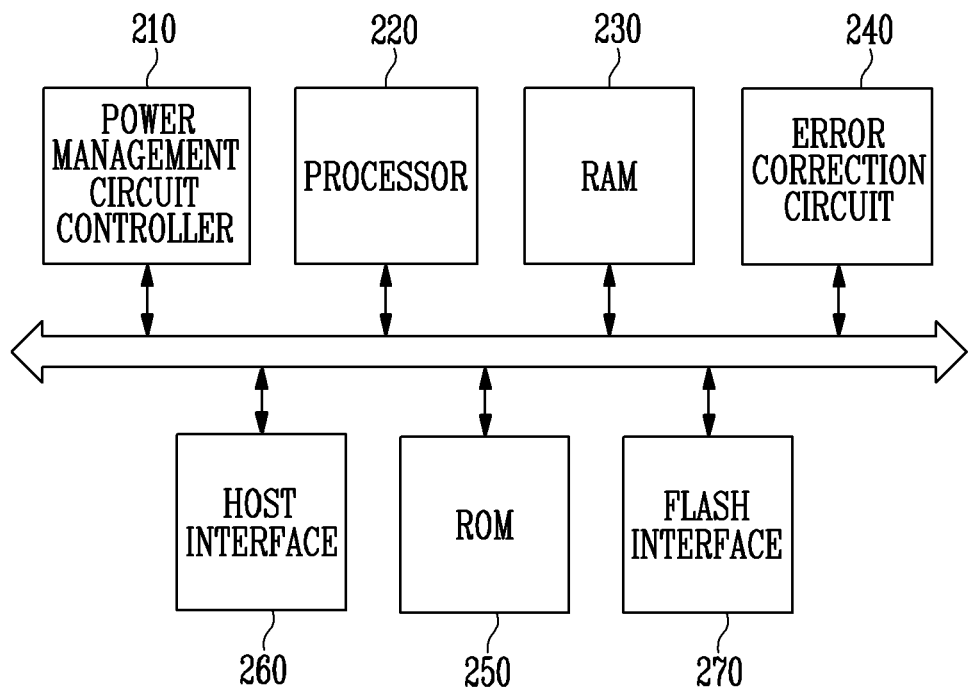
FIG. 4 is a diagram illustrating a memory controller shown in FIG. 1 in accordance with an embodiment of the present disclosure.

FIG. 4 is a diagram illustrating the memory controller shown in FIG. 1 in accordance with an embodiment of the present disclosure.

Referring to FIGS. 1 and 4, the memory controller 200 may include a power management circuit controller 210, a processor 220, a RAM 230, an error correction circuit 240, a ROM 250, a host interface 260, and a flash interface 270.

The power management circuit controller 210 may control an operation of the power management circuit 300.

In an embodiment, the power management circuit controller 210 may determine a magnitude of a power voltage provided from the power management circuit 300. For example, the power management circuit controller 210 may determine a magnitude of a power voltage provided to a plurality of power switch cells according to whether the plurality of power switch cells are to supply power to the memory device 100 and the memory controller 200. The power switch cell may be a module which controls power supplied to the memory device 100 and the memory controller 200. For example, the power switch cell may supply power to the memory device 100 and the memory controller 200 or interrupt the supply of power to the memory device 100 and the memory controller 200 according to an operation mode of the storage device 50. When the operation mode is a normal mode, the plurality of power switch cells may supply power to the memory device 100 and the memory controller 200. The normal mode may be a mode in which the storage device 50 normally performs an operation. When the operation mode is a power saving mode, the plurality of power switch cells may interrupt power supplied to the memory device 100 and the memory controller 200. The power saving mode may represent various operation modes for minimizing consumption of power, such as a sleep mode, a standby mode, or a power-off mode.

A leakage current may occur due to a miniaturization process of transistors included in the memory device 100 and the memory controller 200. The power switch cell controls the supply of power, so that the leakage current can be decreased. However, a leakage current may occur even in the power switch cell. Thus, in accordance with an embodiment of the present disclosure, the magnitude of the power voltage provided to the plurality of power switch cells is determined according to whether power is to be supplied. Accordingly, the leakage current can be decreased, and power efficiency can be increased.

The processor 220 may control overall operations of the memory controller 200. The RAM 230 may be used as a buffer memory, a cache memory, a working memory, or the like of the memory controller 200.

The error correction circuit 240 may perform error correction. The error correction circuit 240 may perform error correction code (ECC) encoding on data to be written to the memory device through the flash interface 270. The ECC-encoded data may be transferred to the memory device through the flash interface 270. The error correction circuit 240 may perform ECC decoding on data received from the memory device through the flash interface 270. The error correction circuit 240 may be included as a component of the flash interface 270 in the flash interface 270.

The ROM 250 may store, in the form of firmware, various information required in an operation of the memory controller 200.

The memory controller 200 may communicate with an external device (e.g., the host 400, an application processor, or the like) through the host interface 260.

The memory controller 200 may communicate with the memory device 100 through the flash interface 270. The memory controller 200 may transmit a command, an address, a control signal, and the like to the memory device 100 through the flash interface 270, and receive data DATA.

The flash interface 270 may include a NAND interface.

In the above-described embodiment, it has been described that the power management circuit controller 210 is one of components of the memory controller 200. However, the present disclosure is not necessarily limited thereto. In some embodiments, the power management circuit controller 210 may be implemented as one component of the processor 220 or be implemented in the form of firmware stored in the ROM 250.

Figure 5:
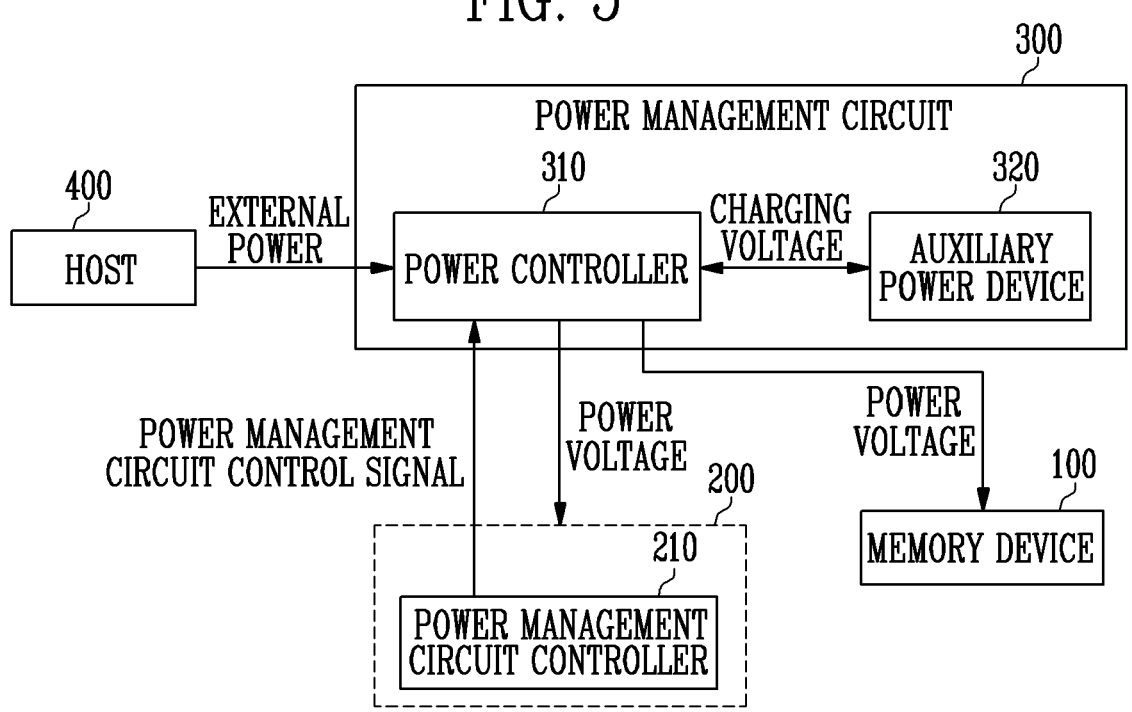
FIG. 5 is a diagram illustrating a power management circuit shown in FIG. 1 in accordance with an embodiment of the present disclosure.

FIG. 5 is a diagram illustrating the power management circuit shown in FIG. 1 in accordance with an embodiment of the present disclosure.

Referring to FIG. 5, the power management circuit 300 may include a power controller 310 and an auxiliary power device 320.

The power controller 310 may select one of external power and auxiliary power and provide the selected power to the memory device 100 and the memory controller 200.

The power controller 310 may receive external power input from the host 400. The power controller 310 may provide a charging voltage to the auxiliary power device 320. The auxiliary power device 320 may charge auxiliary power cells included therein by using the charging voltage. The power controller 310 may provide the external power to the memory device 100 and the memory controller 200. Also, the power controller 310 may provide a charging voltage to the auxiliary power device 320 by using the external power. When the external power is not input or when a voltage level of the external power is lower than a specific voltage level, the power management circuit 300 cannot receive the external power. In this situation, the power controller 310 may provide auxiliary power to the memory device 100 and the memory controller 200 by using a voltage charged in the auxiliary power device 320. The auxiliary power may be supplied by the auxiliary power cells included in the auxiliary power device 320. Therefore, the auxiliary power may have a limited magnitude.

The external power input to the power management circuit 300 may be supplied to the memory device 100 and the memory controller 200. Alternatively, when there occurs a situation in which the voltage level of the external power is lower than the specific voltage level, the auxiliary power stored in the power management circuit may be supplied to the memory device 100 and the memory controller 200 for a certain amount of time.

In an embodiment, the power management circuit controller 210 may control the power management circuit 300 to determine a magnitude of a power voltage according to whether a plurality of power switch cells are to supply power to the memory device 100 and the memory controller 200. The plurality of power switch cells may supply power to the memory device 100 and the memory controller 200 or interrupt the supply of the power to the memory device 100 and the memory controller 200 according to an operation mode of the storage device 50. The power controller 310 may receive a power management circuit control signal from the power management circuit controller 210. The power management circuit control signal may control the power controller 310 to change the magnitude of the power voltage provided to the plurality of power switch cells.

For example, when the plurality of power switch cells supply power to the memory device 100 and the memory controller 200, the power management circuit controller 210 may control the power controller 310 to provide a first power voltage to the plurality power switch cells. The first power voltage may be a voltage at which the memory device 100 and the memory controller 200 operate.

In another example, when the plurality of power switch cells interrupt power supplied to the memory device 100 and the memory controller 200, the power management circuit controller 210 may control the power controller 310 to provide a second power voltage to the plurality of power switch cells. The second power voltage may be a voltage lower than the first power voltage. In an embodiment, the second power voltage may be a voltage having a smallest magnitude among voltages at which the plurality of power switch cells can normally operate. That is, the second power voltage may be a voltage having a minimum level at which the plurality of power switch cells can normally operate. For example, the second power voltage may be set by considering a characteristic of a transistor constituting the plurality of power switch cells, a variation in a process phase of the plurality of power switch cells, and the like.

Figure 6A:
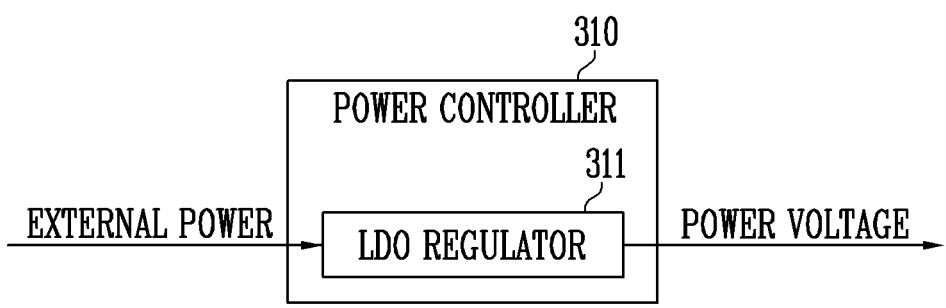
FIG. 6A is a diagram illustrating an example of a power controller in accordance with an embodiment of the present disclosure.

FIG. 6A is a diagram illustrating an example of a power controller in accordance with an embodiment of the present disclosure.

Referring to FIG. 6A, the power controller 310 may generate a power voltage having a magnitude suitable for the memory device 100 and the memory controller 200, based on the external power or the auxiliary power.

The power controller 310 may include a regulator (e.g., a Low Drop Output (LDO) regulator) 311. The power controller 310 may change the magnitude of the power voltage through the LDO regulator 311. The LDO regulator 311 may be a linear regulator which operates even at a low input/output potential difference. The LDO regulator 311 may lower an output voltage with respect to an input voltage.

In an embodiment, the LDO regulator 311 may receive the external power or the auxiliary power, and generate a power voltage having a level available in the memory device 100 and the memory controller 200.

In an embodiment, when the plurality of power switch cells supply power to the memory device 100 and the memory controller 200, the LDO regulator 311 may generate the first power voltage under the control of the power management circuit controller 210. Also, when the plurality of power switch cells interrupt the power supplied to the memory device 100 and the memory controller 200, the LDO regulator 311 may generate the second power voltage under the control of the power management circuit controller 210.

Figure 6B:
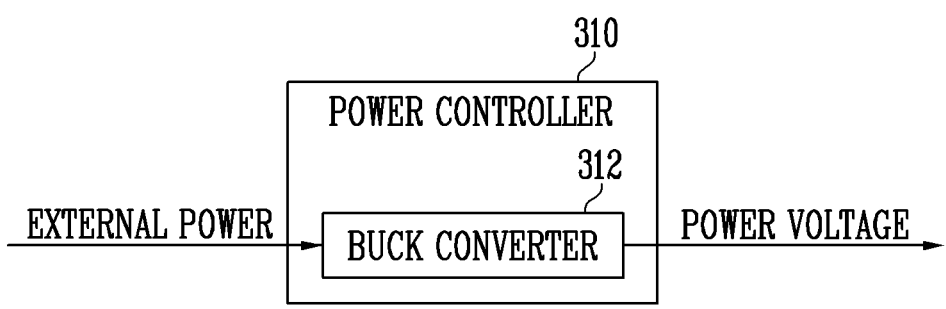
FIG. 6B is a diagram illustrating another example of a power controller in accordance with an embodiment of the present disclosure.

FIG. 6B is a diagram illustrating another example of a power controller in accordance with an embodiment of the present disclosure.

Referring to FIG. 6B, the power controller 310 may include a buck converter 312. The buck converter 312 is a step-down converter, and may lower an output voltage with an input voltage. The power controller 310 may change the magnitude of the power voltage.

In an embodiment, the buck converter 312 may receive the external power or the auxiliary power, and generate a power voltage having a level available in the memory device 100 and the memory controller 200.

In an embodiment, when the plurality of power switch cells supply power to the memory device 100 and the memory controller 200, the buck converter 312 may generate the first power voltage under the control of the power management circuit controller 210. Also, when the plurality of power switch cells interrupt the power supplied to the memory device 100 and the memory controller 200, the buck converter 312 may generate the second power voltage under the control of the power management circuit controller 210.

Figure 7:
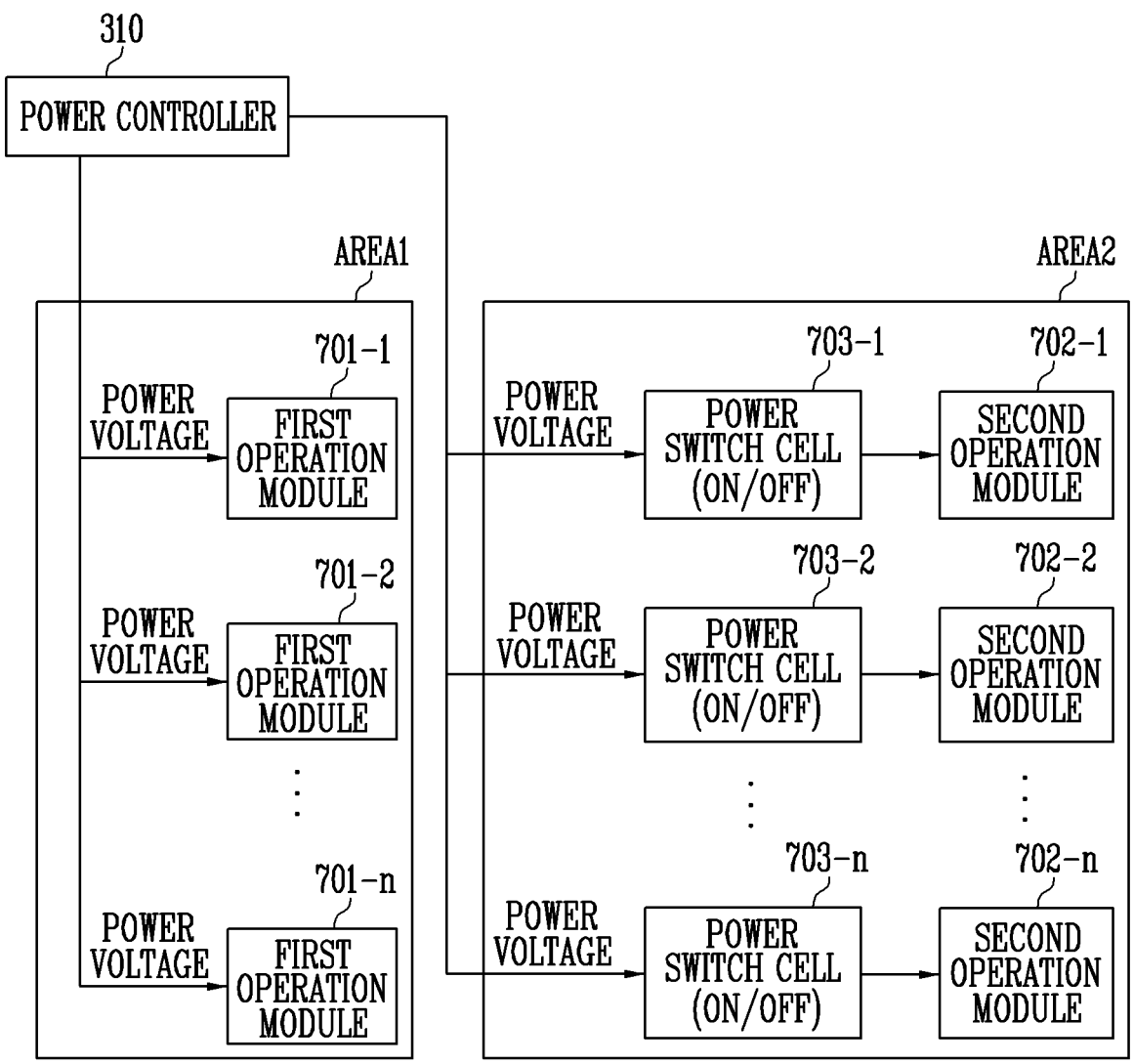
FIG. 7 is a diagram illustrating a first operation area and a second operation area in accordance with an embodiment of the present disclosure.

FIG. 7 is a diagram illustrating a first operation area and a second operation area in accordance with an embodiment of the present disclosure.

Referring to FIG. 7, the memory device 100 and the memory controller 200 may include a first operation area AREA1 and a second operation area AREA2.

In an embodiment, the first operation area AREA1 may include a plurality of first operation modules 701-1 to 701-n. The first operation area AREA1 may be supplied with power regardless of the operation mode of the storage device 50.

The plurality of first operation modules 701-1 to 701-n may be modules which are supplied with power regardless of the operation mode. For example, the plurality of first operation modules 701-1 to 701-n may be modules included in the power management circuit controller 210, the processor 220, the host interface 260, the flash interface 270, and the like of the memory controller 200. The power management circuit controller 210, the processor 220, and the like may always operate regardless of the operation mode to control an operation of the storage device 50. Since interface devices such as the host interface 260 and the flash interface 270 receive a signal from the host 400 or the memory device 100, the interface devices may always operate regardless of the operation mode.

In an embodiment, the power controller 310 may provide a power voltage to the plurality of first operation modules 701-1 to 701-n.

The second operation area AREA2 may include a plurality of second operation modules 702-1 to 702-n and a plurality of power switch cells 703-1 to 703-n. The second operation area AREA2 may be supplied with power or the power supplied to the second operation area AREA2 may be interrupted, according to the operation mode of the storage device 50.

The plurality of second operation modules 702-1 to 702-n may be supplied with power or the supply of the power to the plurality of second operation modules 702-1 to 702-n may be interrupted, according to the operation mode. For example, the plurality of second operation modules 702-1 to 702-n may be modules included in the error correction circuit 240 of the memory controller 200, the memory device 100, and the like.

The plurality of power switch cells 703-1 to 703-n may control the power supplied to the plurality of second operation modules 702-1 to 702-n. In FIG. 7, one power switch cell is connected to one second operation module. However, in some embodiments, one power switch cell may be connected to a plurality of second operation modules.

In an embodiment, the power controller 310 may provide a power voltage to the plurality of power switch cells 703-1 to 703-n. The plurality of power switch cells 703-1 to 703-n may control the power supplied to the plurality of second operation modules 702-1 to 702-n, based on the power voltage. The plurality of power switch cells 703-1 to 703-n may be on/off according to the operation mode of the storage device 50. For example, when the operation mode is the normal mode, the power switch cells 703-1 to 703-n may be on. The plurality of power switch cells 703-1 to 703-n may supply the power to the plurality of second operation modules 702-1 to 702-n. In another example, when the operation mode is the power saving mode, the power switch cells 703-1 to 703-n may be off. The plurality of power switch cells 703-1 to 703-n may interrupt the power supplied to the plurality of second operation modules 702-1 to 702-n.

The above-described first and second operation modules are merely examples. In some embodiments, modules corresponding to the first operation module and the second operation module may be variously set.

Figure 8:
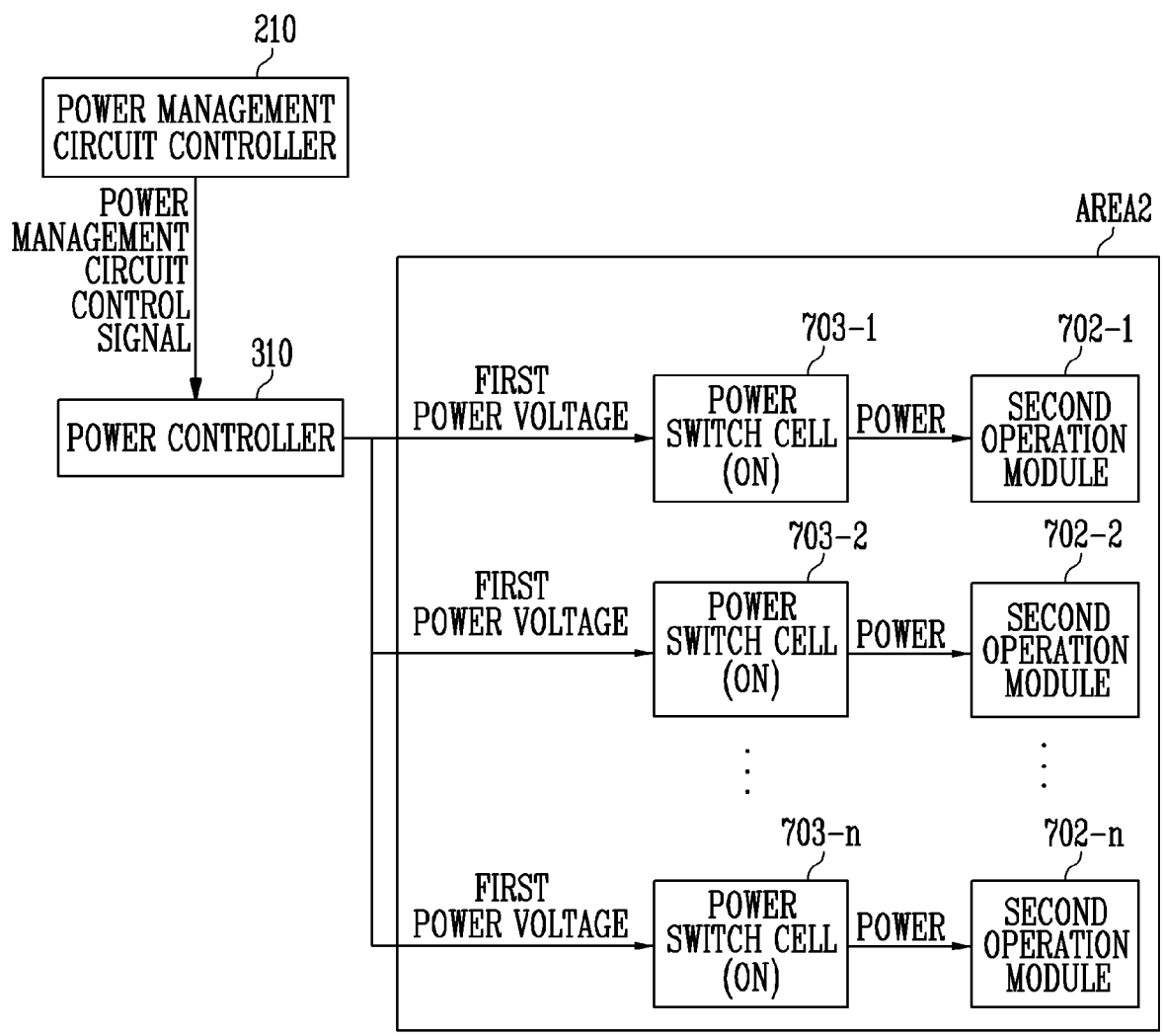
FIG. 8 is a diagram illustrating an example of an operation of determining a magnitude of a power voltage in accordance with an embodiment of the present disclosure.

FIG. 8 is a diagram illustrating an example of an operation of determining a magnitude of a power voltage in accordance with an embodiment of the present disclosure.

Referring to FIG. 8, when the operation mode is the normal mode, the power switch cells 703-1 to 703-n may be on. The power management circuit controller 210 may provide the power controller 310 with a power management circuit control signal for providing the first power voltage. The power controller 310 may provide the first power voltage to the plurality of power switch cells 703-1 to 703-n according to the power management circuit control signal. The plurality of power switch cells 703-1 to 703-n may supply power to the plurality of second operation modules 702-1 to 702-n, based on the first power voltage.

Figure 9:
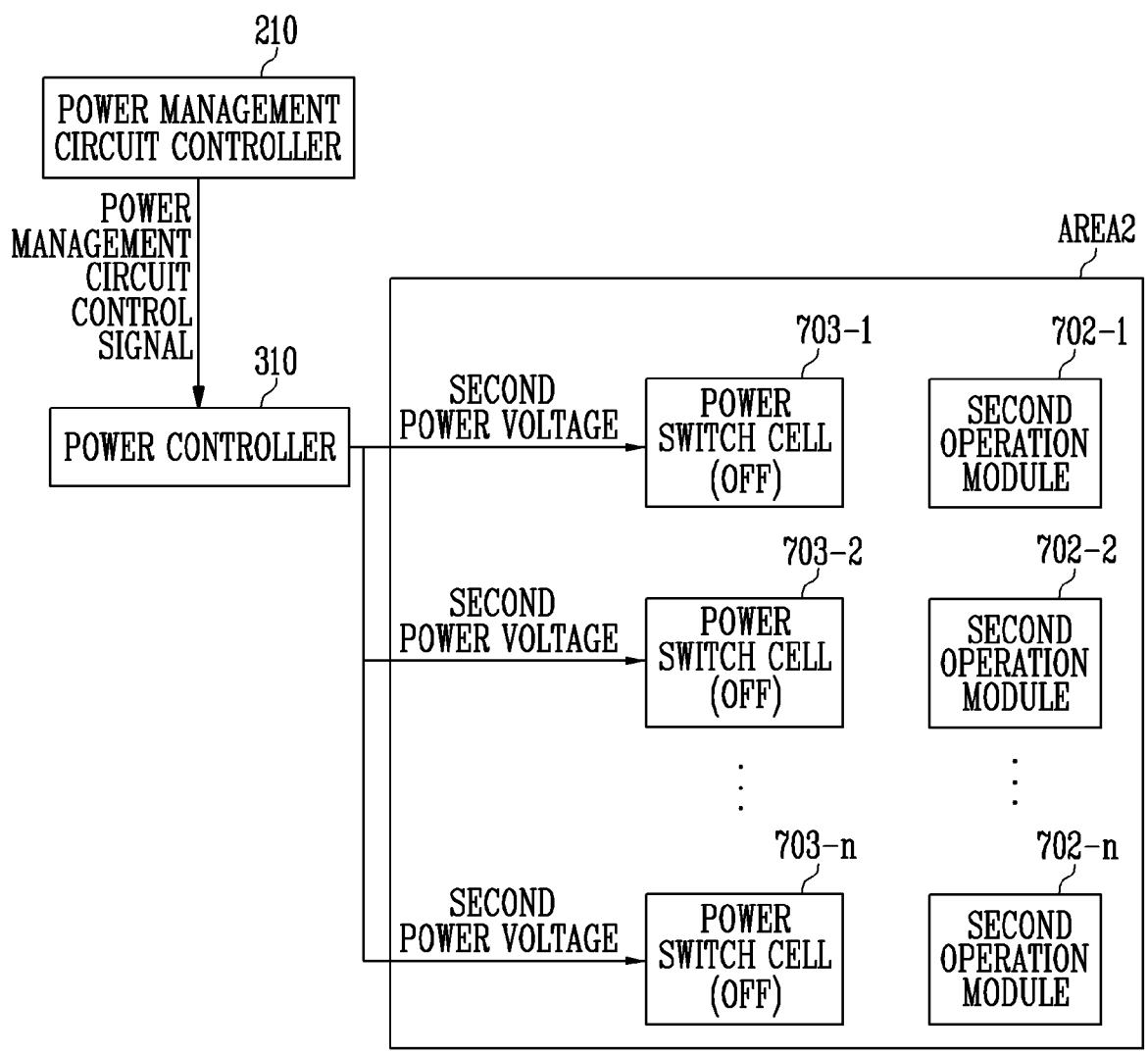
FIG. 9 is a diagram illustrating another example of an operation of determining a magnitude of a power voltage in accordance with an embodiment of the present disclosure.

FIG. 9 is a diagram illustrating another example of an operation of determining a magnitude of a power voltage in accordance with an embodiment of the present disclosure.

Referring to FIG. 9, when the operation mode is the power saving mode, the power switch cells 703-1 to 703-n may be off. The plurality of power switch cells 703-1 to 703-n may interrupt the power supplied to the plurality of second operation modules 702-1 to 702-n. The power management circuit controller 210 may provide the power controller 310 with a power management circuit control signal for providing the second power voltage. The power controller 310 may provide the second power voltage to the plurality of power switch cells 703-1 to 703-n according to the power management circuit control signal.

Thus, in accordance with the embodiment of the present disclosure, a power voltage having a minimum magnitude necessary for an operation of the plurality of power switch cells 703-1 to 703-n which are in an off-state, is provided. Accordingly, a leakage current can be decreased, and power efficiency can be improved.

Figure 10:
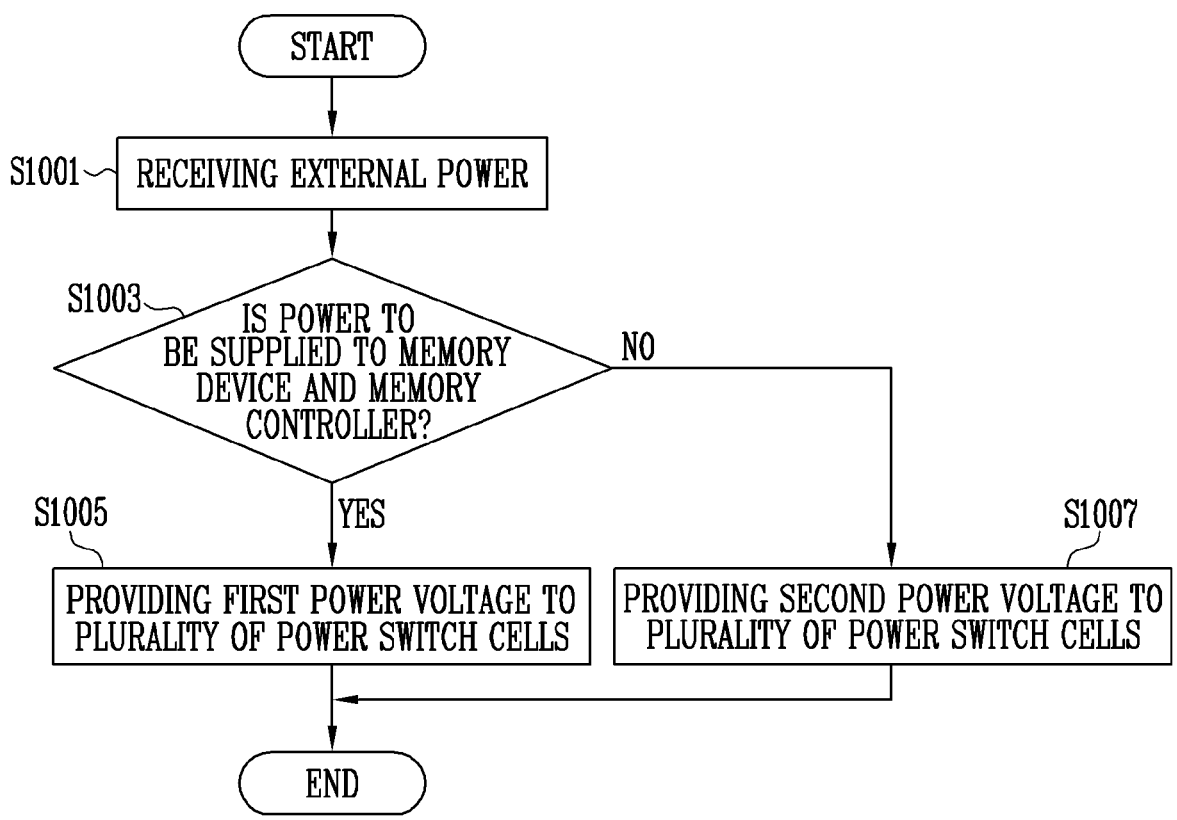
FIG. 10 is a diagram illustrating an operating method of a storage device in accordance with an embodiment of the present disclosure.

FIG. 10 is a diagram illustrating an operating method of a storage device in accordance with an embodiment of the present disclosure.

The operating method shown in FIG. 10 may be performed by the storage device 50 shown in FIG. 1.

Referring to FIG. 10, in operation S1001, the storage device 50 may be supplied with external power from the host 400.

In operation S1003, the storage device 50 may determine whether power is to be supplied to the memory device 100 and the memory controller 200 through the plurality of power switch cells. The storage device 50 may change a magnitude of a voltage provided to the plurality of power switch cells according to whether the power is to be supplied. In an embodiment, the storage device 50 may change a magnitude of a power voltage through at least one of the LDO regulator and the buck converter. Subsequently, the storage device 50 may provide the power voltage having the changed magnitude to the plurality of power switch cells.

For example, when an operation mode of the storage device 50 is a normal mode, the storage device 50 may supply the power to the memory device 100 and the memory controller 200. The storage device 50 may change the power voltage to a first power voltage. In operation S1005, the storage device 50 may provide the first power voltage to the plurality of power switch cells.

Alternatively, when the operation mode is a power saving mode, the storage device 50 may interrupt the power supplied to the memory device 100 and the memory controller 200. The storage device 50 may change the power voltage to a second power voltage. In operation S1007, the storage device 50 may provide the second power voltage to the plurality of power switch cells.

Figure 11:
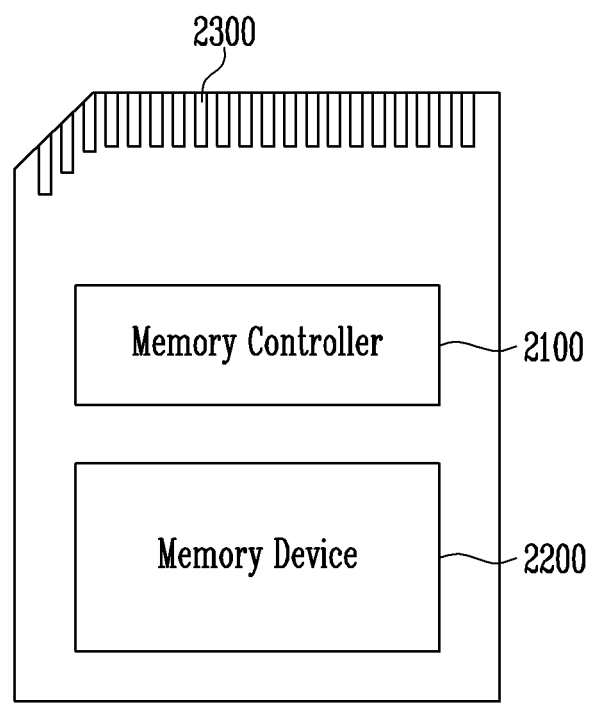
FIG. 11 is a block diagram illustrating a memory card system to which the storage device is applied in accordance with an embodiment of the present disclosure.

FIG. 11 is a block diagram illustrating a memory card system to which the storage device is applied in accordance with an embodiment of the present disclosure.

Referring to FIG. 11, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control read, write, erase, and background operations of the memory device 2200. The memory controller 2100 provides an interface between the memory device 2200 and a host Host. The memory controller 2100 drives firmware for controlling the memory device 2200. The memory controller 2100 may be implemented identically to the memory controller 200 described with reference to FIG. 1. The memory device 2200 may be implemented identically to the memory device 100 described with reference to FIG. 1.

The memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. The memory controller 2100 may communicate with the external device through at least one of various communication standards or interfaces, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. The connector 2300 may be defined by at least one of the above-described various communication standards or interfaces.

The memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), a secure digital (SD) card (SD, miniSD, microSD and SDHC), and a Universal Flash Storage (UFS).

Figure 12:
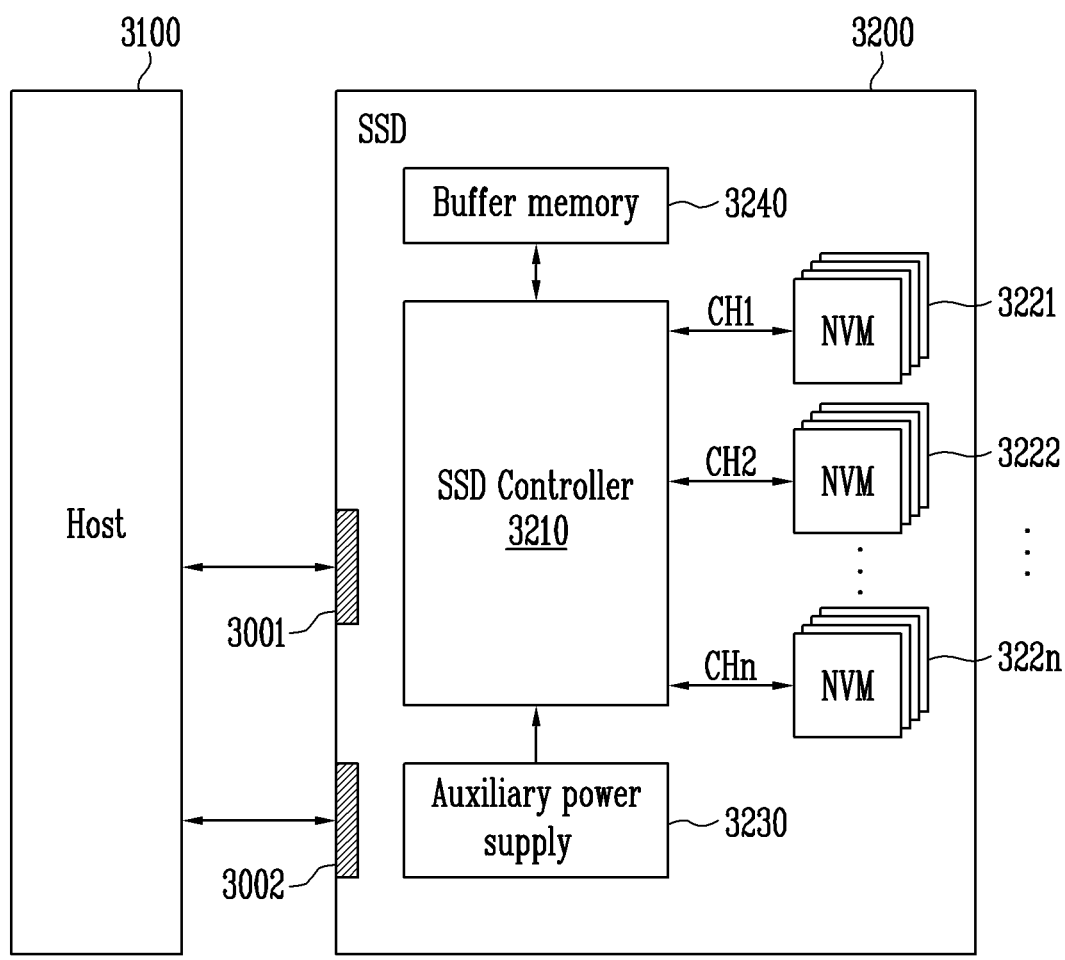
FIG. 12 is a block diagram illustrating a Solid State Drive (SSD) system to which the storage device is applied in accordance with an embodiment of the present disclosure.

FIG. 12 is a block diagram illustrating a Solid State Drive (SSD) system to which the storage device is applied in accordance with an embodiment of the present disclosure.

Referring to FIG. 12, the SSD system 3000 includes a host 3100 and an SSD 3200. The SSD 3200 exchanges a signal with the host 3100 through a signal connector 3001, and receives power through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal received from the host 3100. The signal may be a signal based on an interface between the host 3100 and the SSD 3200. For example, the signal may be a signal defined by at least one of communication standards or interfaces, such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a Wi-Fi, a Bluetooth, and an NVMe. The auxiliary power supply 3230 is connected to the host 3100 through the power connector 3002. The auxiliary power supply 3230 may receive the power PWR input from the host 3100, and charge the power PWR. When the supply of power from the host 3100 is not smooth, the auxiliary power supply 3230 may provide power of the SSD 3200. The auxiliary power supply 3230 may be located in the SSD 3200, or be located at the outside of the SSD 3200. For example, the auxiliary power supply 3230 may be located on a main board, and provide auxiliary power to the SSD 3200. The auxiliary power supply 3230 may be implemented identically to the auxiliary power device 320 described with reference to FIG. 5.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 13:
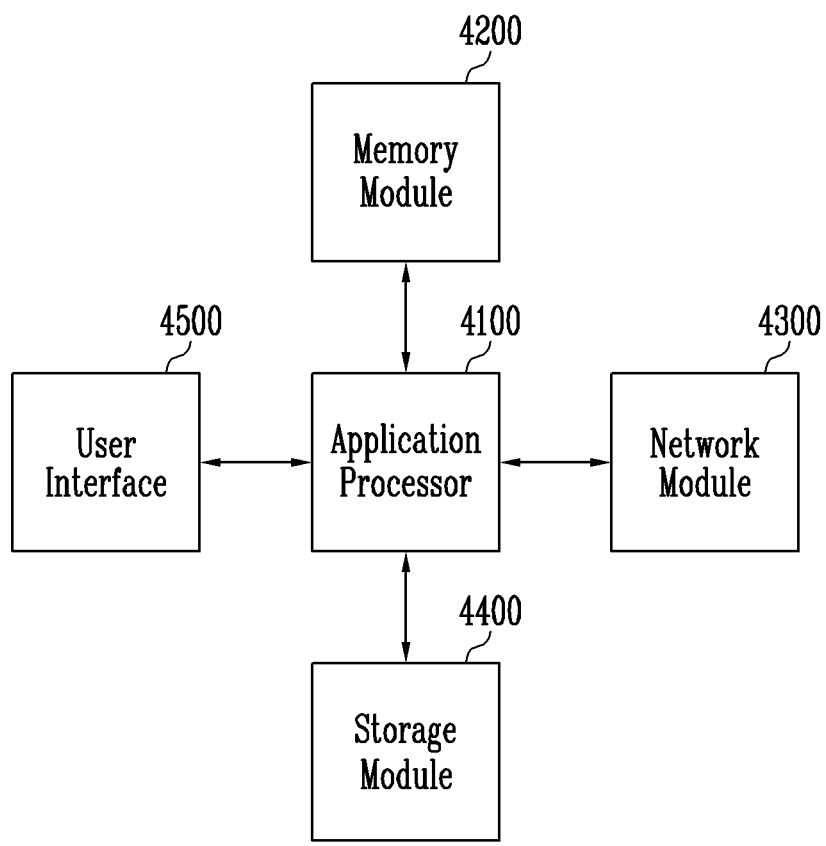
FIG. 13 is a block diagram illustrating a user system to which the storage device is applied in accordance with an embodiment of the present disclosure.

FIG. 13 is a block diagram illustrating a user system to which the storage device is applied in accordance with an embodiment of the present disclosure.

Referring to FIG. 13, the user system 4000 includes an application processor 4100, a memory module 4200, a network module 4300, a storage module 4400, and a user interface 4500.

The application processor 4100 may drive components included in the user system 4000, an operating system (OS), a user program, or the like. The application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 4100 and the memory module 4200 may be provided as one semiconductor package by being packaged based on a Package on Package (POP).

The network module 4300 may communicate with external devices. The network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), WiMAX, WLAN, UWB, Bluetooth, and Wi-Fi. The network module 4300 may be included in the application processor 4100.

The storage module 4400 may store data. For example, the storage module 4400 may store data received from the application processor 4100. Alternatively, the storage module 4400 may transmit data stored therein to the application processor 4100. The storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. The storage module 4400 may be provided as a removable drive such as a memory card of the user system 4000 or an external drive.

The storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. The user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there is provided a storage device capable of decreasing a leakage current and an operating method of the storage device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, those are only to describe the embodiments of the present disclosure. Therefore, the present disclosure should not be restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims. Furthermore, the embodiments may be combined to form additional embodiments.

What is claimed is:

1. A storage device comprising:
a plurality of power switch cells configured to control power supplied to a memory device and a memory controller for controlling the memory device;
a power management circuit configured to provide the plurality of power switch cells with a power voltage corresponding to the power; and
a power management circuit controller configured to control the power management circuit to determine a magnitude of the power voltage according to whether the plurality of power switch cells supply the power to the memory device and the memory controller,
wherein the power management circuit controller is configured to control the power management circuit to reduce the magnitude of the power voltage, in response to interrupting the power supplied to the memory device and the memory controller.

2. The storage device of claim 1, wherein the plurality of power switch cells supply the power to the memory device and the memory controller or interrupt the power supplied to the memory device and the memory controller, according to an operation mode of the storage device.

3. The storage device of claim 2, wherein, when the operation mode is a normal mode, the plurality of power switch cells supply the power to the memory device and the memory controller.

4. The storage device of claim 2, wherein, when the operation mode is a power saving mode, the plurality of power switch cells interrupt the power supplied to the memory device and the memory controller.

5. The storage device of claim 1, wherein, when the plurality of power switch cells supply the power to the memory device and the memory controller, the power management circuit controller controls the power management circuit to provide the plurality of power switch cells with a first power voltage at which the memory device and the memory controller operate.

6. The storage device of claim 5, wherein, when the plurality of power switch cells interrupt the power supplied to the memory device and the memory controller, the power management circuit controller controls the power management circuit to provide the plurality of power switch cells with a second power voltage lower than the first power voltage.

7. The storage device of claim 6, wherein the second power voltage is a voltage having a smallest magnitude among voltages at which the plurality of power switch cells normally operate.

8. The storage device of claim 1, wherein the power management circuit includes a power controller configured to receive external power supplied from a host and generate the power voltage based on the external power.

9. The storage device of claim 8, wherein the power controller includes a Low Drop Output (LDO) regulator and is further configured to change the magnitude of the power voltage through the LDO regulator.

10. The storage device of claim 8, wherein the power controller includes a buck converter and is further configured to change the magnitude of the power voltage through the buck converter.

11. The storage device of claim 1, wherein the memory device and the memory controller include:
 a first operation area to which the power is supplied regardless of an operation mode of the storage device; and
 a second operation area to which the power is supplied or is interrupted according to the operation mode of the storage device.

12. The storage device of claim 11, wherein the plurality of power switch cells are included in the second operation area and control the power supplied to the second operation area.

13. The storage device of claim 1, wherein the power management circuit controller is included in the memory controller.

14. A method of operating a storage device, the method comprising:
 determining whether to supply power to a memory device and a memory controller through a plurality of power switch cells;
 changing a magnitude of a power voltage corresponding to the power according to a result of the determining; and
 providing the plurality of power switch cells with the power voltage having the changed magnitude,
 wherein the changing includes reducing the magnitude of the power voltage in response to the power determined to be interrupted to the memory device and the memory controller.

15. The method of claim 14, wherein the determining includes determining to supply the power to the memory device and the memory controller when an operation mode of the storage device is a normal mode.

16. The method of claim 15, wherein the changing further includes changing the power voltage to a first power voltage at which the memory device and the memory controller operate in response to the power is determined to be supplied to the memory device and the memory controller before reducing the magnitude of the power voltage.

17. The method of claim 14, wherein the determining includes determining to interrupt the power to the memory device and the memory controller when an operation mode of the storage device is a power saving mode.

18. The method of claim 17, wherein the reducing includes changing the power voltage to a second power voltage lower than a first power voltage in response to the power is determined to be interrupted to the memory device and the memory controller.

19. The method of claim 18, wherein the second power voltage is a voltage having a smallest magnitude among voltages at which the plurality of power switch cells normally operate.

20. A power supply circuit comprising:
 a power circuit configured to provide an element with power supply in a first mode and cut the power supply off in a second mode; and
 a charging circuit configured to provide the power circuit with a charging voltage in the first mode, and reduce a magnitude of the charging voltage provided to the power circuit in the second mode.

21. The power supply circuit of claim 20, wherein the charging voltage having a reduced magnitude has a least magnitude required for a power switch cell in the power circuit to normally operate.

* * * * *